US012584962B2

(12) United States Patent (10) Patent No.: US 12,584,962 B2
Imanaka (45) Date of Patent: Mar. 24, 2026

(54) METHOD FOR DIAGNOSING FAILURE OF CURRENT BREAKING DEVICE AND ENERGY STORAGE APPARATUS

(71) Applicant: GS Yuasa International Ltd., Kyoto (JP)

(72) Inventor: Yuki Imanaka, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 74 days.

(21) Appl. No.: 17/917,019

(22) PCT Filed: Mar. 24, 2021

(86) PCT No.: PCT/JP2021/012108
§ 371 (c)(1),
(2) Date: Oct. 5, 2022

(87) PCT Pub. No.: WO2021/205871
PCT Pub. Date: Oct. 14, 2021

(65) Prior Publication Data
US 2023/0152376 A1 May 18, 2023

(30) Foreign Application Priority Data
Apr. 8, 2020 (JP) ................................. 2020-069688

(51) Int. Cl.
*G01R 31/327* (2006.01)
*G01R 19/165* (2006.01)
(Continued)

(52) U.S. Cl.
CPC ....... *G01R 31/3275* (2013.01); *G01R 19/165* (2013.01); *G01R 31/006* (2013.01); *H01H 47/002* (2013.01); *H02J 7/0031* (2013.01)

(58) Field of Classification Search
CPC .............. G01R 31/3275; G01R 31/006; G01R 19/165; H01H 47/002; H02J 7/0031
(Continued)

(56) References Cited

U.S. PATENT DOCUMENTS 10,126,498 B1* 11/2018 Ma .......................... G02F 1/011
10,305,299 B2* 5/2019 Shiraishi ............. H02J 7/00306
(Continued)

FOREIGN PATENT DOCUMENTS

CN 102386638 A * 3/2012 .......... G01R 19/165
JP 2012-100438 A 5/2012
(Continued)

OTHER PUBLICATIONS

Gyu; Translation of KR20110026595A; Mar. 16, 2011; Translated by Google & EPO (Year: 2011).*
(Continued)

*Primary Examiner* — Alesa Allgood
*Assistant Examiner* — Rahul Maini
(74) *Attorney, Agent, or Firm* — Alston & Bird LLP

(57) ABSTRACT

A method for diagnosing failure of a current breaking device 21A included in a power supply system 12 of a vehicle 1 includes: a supply step of supplying power to a first electric load 11 and a first energy storage apparatus 13 by a power supply apparatus 14; a command step of commanding the current breaking device 21A to perform cutoff while power is supplied from the power supply apparatus 14 to the first electric load 11 and the first energy storage apparatus 13; and a determination step of measuring a charge current of a secondary battery 20A by a current sensor 21B while the cutoff is commanded to the current breaking device 21A, and determining presence or absence of failure of the current breaking device 21A based on a measured current value.

15 Claims, 10 Drawing Sheets

(51) Int. Cl.
    *G01R 31/00*        (2006.01)
    *H01H 47/00*       (2006.01)
    *H02J 7/00*         (2006.01)

(58) Field of Classification Search
    USPC ............ 324/414, 424 M, 426, 430–435, 424
    See application file for complete search history.

(56)            References Cited

U.S. PATENT DOCUMENTS

| | | | |
|---|---|---|---|
| 2005/0253458 A1* | 11/2005 | Omae ........................ | H02J 7/34 |
| | | | 307/10.1 |
| 2007/0188140 A1* | 8/2007 | Chen ..................... | H02J 7/0031 |
| | | | 320/128 |
| 2013/0188965 A1* | 7/2013 | Afriat .................. | H01R 13/518 |
| | | | 398/192 |
| 2013/0320986 A1 | 12/2013 | Shiraishi et al. | |
| 2014/0176140 A9 | 6/2014 | Shiraishi et al. | |
| 2014/0203830 A1* | 7/2014 | Shin ................... | G01R 31/2601 |
| | | | 324/750.23 |
| 2016/0084908 A1 | 3/2016 | Shiraishi et al. | |
| 2016/0288651 A1 | 10/2016 | Kinoshita | |
| 2017/0214257 A1* | 7/2017 | Shiraishi ............. | H02J 7/00302 |
| 2018/0024196 A1 | 1/2018 | Imura et al. | |
| 2018/0238968 A1* | 8/2018 | Wada ................... | H02J 7/0031 |
| 2019/0271743 A1 | 9/2019 | Imura et al. | |
| 2020/0400749 A1 | 12/2020 | Imanaka | |
| 2021/0165044 A1 | 6/2021 | Imura | |

FOREIGN PATENT DOCUMENTS

| | | | | |
|---|---|---|---|---|
| JP | 2012-253993 A | 12/2012 | | |
| JP | 2014-036556 A | 2/2014 | | |
| JP | 2014-048281 A | 3/2014 | | |
| JP | 2015-037015 A | 2/2015 | | |
| JP | 2016-193634 A | 11/2016 | | |
| JP | 2017-135834 A | 8/2017 | | |
| JP | 2018-129913 A | 8/2018 | | |
| JP | 2018-136314 A | 8/2018 | | |
| JP | 2019-158446 A | 9/2019 | | |
| KR | 20110026595 A | * 3/2011 | .......... | G01R 31/005 |
| WO | WO-2016/103721 A1 | 6/2016 | | |
| WO | WO-2019/208410 A1 | 10/2019 | | |

OTHER PUBLICATIONS

Yung-Hak et al.; Translation of CN102386638A; Mar. 21, 2012; Translated by Google & EPO (Year: 2012).*
International Search Report and Written Opinion for International Application No. PCT/JP2021/012108, dated Jun. 22, 2021, (11 pages), Japan Patent Office, Tokyo, Japan.

* cited by examiner

METHOD FOR DIAGNOSING FAILURE OF CURRENT BREAKING DEVICE AND ENERGY STORAGE APPARATUS

CROSS REFERENCE TO RELATED APPLICATIONS

This application is a national stage application, filed under 35 U.S.C. § 371, of International Application No. PCT/JP2021/012108, filed Mar. 24, 2021, which claims priority to Japanese Application No. 2020-069688, filed Apr. 8, 2020; the contents of both of which as are hereby incorporated by reference in their entireties.

BACKGROUND

Technical Field

The present invention relates to a method for diagnosing failure of a current breaking device and an energy storage apparatus.

Description of Related Art

In general, an energy storage apparatus including an energy storage device such as a lithium ion secondary battery includes a management device and a current breaking device connected in series with the energy storage device. The management device monitors a state of the energy storage apparatus, and brings the current breaking device into a cutoff state to protect the energy storage apparatus when detecting an abnormality such as overcharge or overdischarge.

The current breaking device may break down. When the current breaking device fails, the energy storage apparatus cannot be protected. For this reason, desirably a failure diagnosis of the current breaking device is performed. An example of a method for diagnosing the failure of the current breaking device is to instruct the current breaking device to perform cutoff while the energy storage apparatus is discharging and to determine presence or absence of the failure based on whether a discharge current stops flowing.

A moving body such as an automobile typically installs an energy storage apparatus (generally, a 12-V energy storage apparatus), which supplies power to an electric load such as a brake, a door lock, a car navigation system, or an immobilizer. For the energy storage apparatus that supplies power to the electric load of the moving body, there is a particular issue that what is called a power failure, in which power supply is interrupted, should not occur regardless of whether the moving body is traveling or parked. When a cutoff command is issued to the current breaking device for the failure diagnosis, the current breaking device enters a cutoff state unless the current breaking device has a failure. Thus, means for continuing the power supply to the electric load even when the current breaking device is brought into the cutoff state by the failure diagnosis are required.

Patent Document WO 2016/103721 discloses a technique for diagnosing a failure of a first switch (corresponding to the current breaking device) using a switch circuit that bypasses current when performing the failure diagnosis. Specifically, a power supply protective device described in Patent Document 1 includes a switch circuit connected in parallel with the first switch, the switch circuit including a second switch and a voltage drop element connected in series with the second switch and configured to cause a voltage drop of a reference voltage when the current flows.

The power supply protective device determines whether the first switch has a failure based on an open voltage and a closed voltage, the open voltage is detected in the case where the second switch is in a closed state and the first switch is in an open state when the power supply discharges, and the closed voltage is detected in the case where the second switch is in the closed state and the first switch is in the closed state when the power supply discharges.

BRIEF SUMMARY

The power supply protective device described in Patent Document 1 requires a switch circuit that bypasses current during failure diagnosis, which complicates the configuration. Thus, the cost of the energy storage apparatus increases and reliability of the energy storage apparatus decreases. The present specification discloses a technique capable of diagnosing failure of a current breaking device while continuing power supply to an electric load, suppressing complication of the configuration of a power supply system.

A method for diagnosing failure of a current breaking device included in a power supply system of a moving body, the power supply system including a first energy storage apparatus connected to a first electric load of the moving body and a power supply apparatus connected in parallel to the first energy storage apparatus, the first energy storage apparatus including an energy storage device, the current breaking device connected in series with the energy storage device, and a current sensor that measures a charge current of the energy storage device, the failure diagnosis method comprising: a supply step in which the power supply apparatus supplies power to the first electric load and the first energy storage apparatus; a command step of commanding the current breaking device to perform cutoff while power is supplied from the power supply apparatus to the first electric load and the first energy storage apparatus; and a determination step of measuring the charge current of the energy storage device using the current sensor while the cutoff is issued to the current breaking device, and determining presence or absence of failure of the current breaking device based on a measured current value.

The failure of the current breaking device can be diagnosed while the power supply to the electric load is continued with the complication of the configuration of the power supply system being prevented.

DETAILED DESCRIPTION OF VARIOUS EMBODIMENTS

Figure 1:
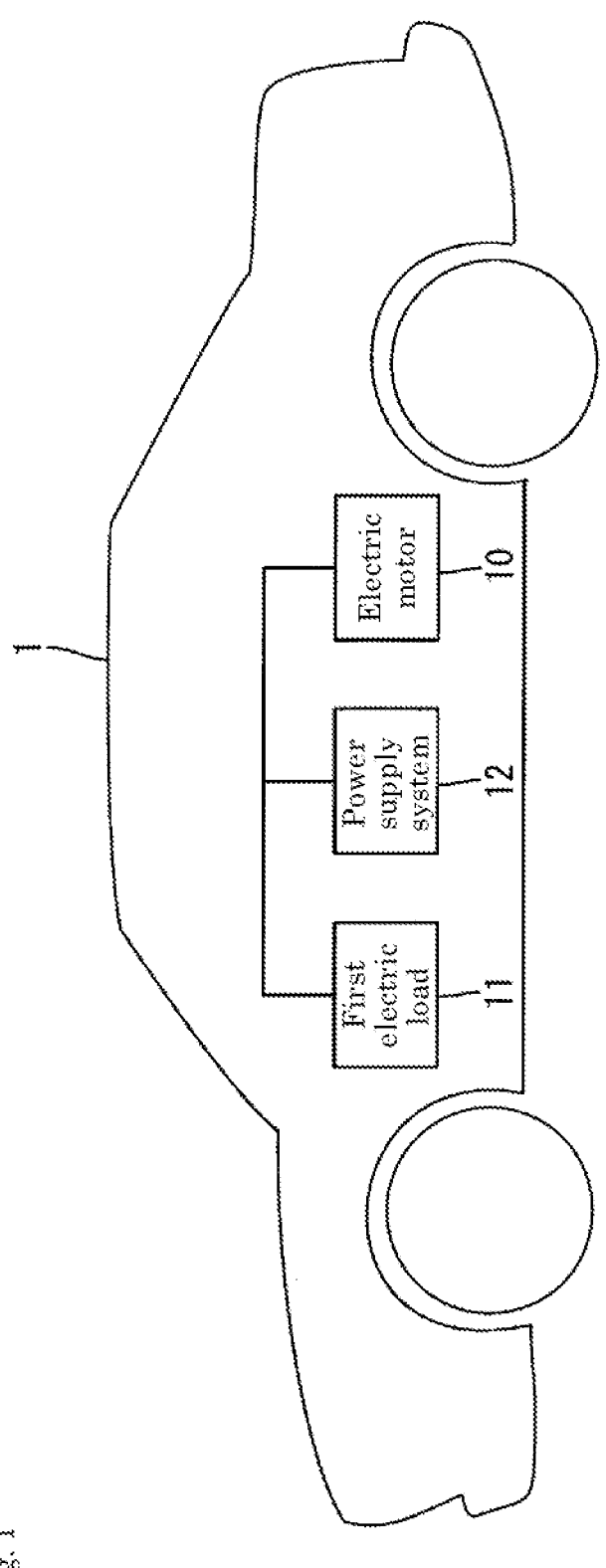
FIG. 1 is a schematic diagram illustrating a vehicle according to a first embodiment.

Outline of Embodiment (1) A method for diagnosing failure of a current breaking device included in a power supply system of a moving body, the power supply system including a first energy storage apparatus connected to a first electric load of the moving body and a power supply apparatus connected in parallel to the first energy storage apparatus, the first energy storage apparatus including an energy storage device, the current breaking device connected in series with the energy storage device, and a current sensor that measures a charge current of the energy storage device, the failure diagnosis method includes: a supply step in which the power supply apparatus supplies power to the first electric load and the first energy storage apparatus; a command step of commanding the current breaking device to perform cutoff while power is supplied from the power supply apparatus to the first electric load and the first energy storage apparatus; and a determination step of measuring the charge current of the energy storage device using the current sensor while the cutoff is issued to the current breaking device, and determining presence or absence of failure of the current breaking device based on a measured current value.

As described above, as a particular issue peculiar to the energy storage apparatus that supplies the power to the electric load of the moving body, what is called a power failure in which power supply is interrupted should not occur regardless of whether the moving body is traveling or parked.

Usually, the power supply system of the moving body includes a power supply apparatus separately from the first energy storage apparatus. For example, in the case of the engine vehicle, a power generator (alternator) using an engine as a power source is provided as the power supply apparatus. In the case of the electric automobile, a high-voltage energy storage apparatus that supplies the power to the electric motor as a drive source of the moving body is provided as the power supply apparatus.

In the failure diagnosis method, the failure diagnosis is performed while the power is supplied from the power supply apparatus to the first electric load and the first energy storage apparatus. Because the power is supplied from the power supply apparatus to the first energy storage apparatus, the charge current flows through the first energy storage apparatus. When the cutoff is issued to the current breaking device in this state, the current breaking device remains in the conduction state in the case where the current breaking device fails, and the current sensor measures a current value greater than or equal to a predetermined value (the current value of the charge current). Thus, it can be determined that the current breaking device fails.

When the current breaking device does not fail, the current breaking device is in the cutoff state, and the current value measured by the current sensor is less than the predetermined value. Thus, it can be determined that the current breaking device does not fail. Because the power is supplied from the power supply apparatus to the first electric load, the power supply to the first electric load is continued even when the current breaking device is in the cutoff state. Thus, the power failure can be prevented.

According to the failure diagnosis method, the component (component providing the power from the first energy storage apparatus to the first electric load even when the current breaking device is in the cutoff state during the failure diagnosis) such as the switch circuit described in Patent Document 1 is not required to be included, so that the failure diagnosis of the current breaking device with continuing the power supply to the first electric load can be implemented while the configuration of the power supply system is prevented from becoming complicated. In other words, the failure of the current breaking device can be diagnosed while preventing the power failure with the complication of the configuration of the power supply system being prevented.

The power supply protective device described in Patent Document 1 determines whether the first switch fails when the power supply (corresponding to the first energy storage apparatus) discharges, and whether the first switch fails cannot be determined when the power supply is charged. According to the above failure diagnosis method, the failure diagnosis can be performed when the first energy storage apparatus is charged.

The above-described "state in which the cutoff is commanded to the current breaking device" refers to a state in which the power is supplied in the case of the current breaking device in which the power supply is required to be continued in order to maintain the cutoff state. In the case of the current breaking device that needs to continue to supply the power in order to maintain the conduction state, this means a state in which the power is not supplied. In the case of the current breaking device that requires the power supply only when the conduction state is switched to the cutoff state and when the cutoff state is switched to the conduction state, it refers to a state from when the power switching from the conduction state to the cutoff state is supplied to when the power switching from the cutoff state to the conduction state is supplied.

(2) The method for diagnosing the failure of the current breaking device may further include a charge determination step of determining whether the energy storage device is charged after the power supply is started. The command step may be executed when the charge determination step determines that the energy storage device is charged.

Even when the supply step is started, there is a possibility that the power is not supplied from the power supply apparatus to the first electric load or the first energy storage apparatus due to the failure of the power supply apparatus or the like. In the case where the cutoff is commanded to the current breaking device in the command step while the power is not supplied from the power supply apparatus, when the current breaking device is in the cutoff state due to no failure, the power is not supplied from the power supply apparatus, and thus, power fails.

According to the failure diagnosis method, the current breaking device is instructed to perform the cutoff after the power is supplied from the power supply apparatus to the first electric load, so that the power failure can be further prevented.

(3) A method for diagnosing failure of a current breaking device included in a power supply system of a moving body, the power supply system including a first energy storage apparatus connected to a first electric load of the moving body and a power supply apparatus connected in parallel to the first energy storage apparatus, the first energy storage apparatus including an energy storage device, the current breaking device connected in series with the energy storage device, and a current sensor that measures a discharge current of the energy storage device, the failure diagnosis method includes: a supply step of supplying power from the first energy storage apparatus to the first electric load while keeping a state where power is supplied from the power supply apparatus to the first electric load when power is not supplied from the first energy storage apparatus to the first electric load; a command step of commanding the current breaking device to perform cutoff while power is supplied from the first energy storage apparatus to the first electric load; and a determination step of measuring the discharge current of the energy storage device using the current sensor while the cutoff is issued to the current breaking device, and determining presence or absence of failure of the current breaking device based on a measured current value.

As described above, as a particular issue peculiar to the energy storage apparatus that supplies the power to the electric load of the moving body, what is called a power failure in which power supply is interrupted should not occur regardless of whether the moving body is traveling or parked.

In the above failure diagnosis method, the power is supplied from the first energy storage apparatus to the first electric load while keeping a state where power is supplied from the power supply apparatus to the first electric load. Because power is supplied from the first energy storage apparatus to the first electric load, the discharge current flows from the first energy storage apparatus. When the cutoff is issued to the current breaking device in this state, the current breaking device remains in the conduction state in the case where the current breaking device fails, and the current sensor measures a current value greater than or equal to a predetermined value (the current value of the discharge current). Thus, it can be determined that the current breaking device has a failure.

When the current breaking device does not have a failure, the current breaking device is in the cutoff state, and the current value measured by the current sensor is less than the predetermined value. Thus, it can be determined that the current breaking device does not have a failure. When the current breaking device becomes the cutoff state, the power is not supplied from the first energy storage apparatus to the first electric load. However, when the power is not supplied from the first energy storage apparatus to the first electric load, the power is supplied from the power supply apparatus to the first electric load, so that the power supply to the first electric load is continued even when the current breaking device is in the cutoff state. Thus, the power failure can be prevented.

According to the failure diagnosis method, because the component such as the switch circuit described in Patent Document 1 is not required to be included, the failure diagnosis of the current breaking device with continuing the power supply to the first electric load can be implemented while preventing the configuration of the power supply system from becoming complicated. In other words, the failure of the current breaking device can be diagnosed while preventing the power failure with the complication of the configuration of the power supply system being prevented.

(4) The method for diagnosing the failure of the current breaking device may further include a supply determination step of determining whether power is supplied from the power supply apparatus to the first electric load when power is not supplied from the first energy storage apparatus to the first electric load after the power supply is started. The command step may be executed when the power supply determination step determines that power is supplied.

There is also a possibility that the power supply apparatus cannot supply the power for some reason. In the case where the cutoff is commanded to the current breaking device in the command step while the power supply apparatus cannot supply the power, when the current breaking device is in the cutoff state due to no failure, the power is not supplied from the power supply apparatus, and thus, power fails.

According to the failure diagnosis method, when the current breaking device is in the cutoff state and when the power supply from the first energy storage apparatus to the first electric load is stopped, the command step is executed after checking that the power is supplied from the power supply apparatus to the first electric load, so that the power failure can be more reliably prevented.

(5) The moving body may be an electric automobile driven by an electric motor, and the power supply apparatus may include a second power storage device that supplies the power to the electric motor and a voltage converter that is connected between the first electric load and the second energy storage apparatus and converts voltage applied from the second energy storage apparatus.

When the voltage applied from the second energy storage apparatus to the voltage converter is made higher than the voltage of the first energy storage apparatus by the voltage converter, the power is supplied from the second energy storage apparatus to the first electric load and the first energy storage apparatus. When the failure diagnosis is performed in this state, the failure of the current breaking device can be diagnosed while the power supply to the first electric load is continued.

Alternatively, when the voltage applied from the second energy storage apparatus to the voltage converter is made lower than the voltage of the first energy storage apparatus by the voltage converter, the power is supplied from the first energy storage apparatus to the first electric load. When the current breaking device is in the cutoff state while the failure diagnosis is performed in this state, the power is supplied from the second energy storage apparatus to the first electric load instead of the first energy storage apparatus. In other words, when the power is not supplied from the first energy storage apparatus to the first electric load, the failure diagnosis is performed while the power is supplied from the power supply apparatus to the first electric load. For this reason, the failure of the current breaking device can be diagnosed while the power supply to the first electric load is continued.

(6) The power supply apparatus may include a second energy storage apparatus that supplies the power to a second electric load different from the first electric load and a voltage converter that is connected between the first electric load and the second energy storage apparatus and converts voltage applied from the second energy storage apparatus.

Separately from the first energy storage apparatus that supplies the power to the first electric load, some moving bodies include a second energy storage apparatus that supplies the power to the second electric load and a voltage converter connected between the first electric load and the second energy storage apparatus.

When the voltage applied from the second energy storage apparatus to the voltage converter is made higher than the voltage of the first energy storage apparatus by the voltage converter, the power is supplied from the second energy storage apparatus to the first electric load and the first energy storage apparatus. When the failure diagnosis is performed in this state, the failure of the current breaking device can be diagnosed while the power supply to the first electric load is continued.

Alternatively, when the voltage applied from the second energy storage apparatus to the voltage converter is made lower than the voltage of the first energy storage apparatus by the voltage converter, the power is supplied from the first energy storage apparatus to the first electric load. When the current breaking device is in the cutoff state while the failure diagnosis is performed in this state, the power is supplied from the second energy storage apparatus to the first electric load instead of the first energy storage apparatus, so that the failure of the current breaking device can be diagnosed while the power supply to the first electric load is continued.

(7) The moving body may be an engine automobile, and the power supply apparatus may be a generator using an engine of the engine automobile as a power source.

The engine automobile includes a generator (alternator) using the engine as the power source, separately from the first energy storage apparatus that supplies the power to the first electric load. When the engine is operating, the power is supplied from the generator to the first electric load and the first energy storage apparatus. Thus, the failure diagnosis is performed when the power is supplied from the generator to the first electric load, so that the failure of the current breaking device can be diagnosed while the power supply to the first electric load is continued.

(8) The supply step may be executed when the moving body is stopped.

Stopping means a state in which the moving body is stopped but the engine operates.

When the current breaking device is brought into the cutoff state, a surge voltage may be generated in the power supply system to which the first energy storage apparatus is connected at the moment of the cutoff state due to an inductance component of the electric cable connected to the first energy storage apparatus. The large surge voltage can cause the failure in the power supply system.

Because the surge voltage follows magnitude of the charge current, desirably the failure diagnosis is performed when the charge current is small in order to decrease the surge voltage. When the charge current is unstable, there is a possibility that the charge current increases at the timing of the failure diagnosis even when the charge current temporarily decreases. Thus, more desirably the failure diagnosis is performed when the charge current is small and stable.

According to the above failure diagnosis method, the supply step is executed when the moving body is stopped. While the vehicle is stopped, the engine rotation speed is stabilized in a lower state than that while the vehicle is traveling, so that the charge current flowing through the first energy storage apparatus is small and stable. Thus, the surge voltage can be reduced.

(9) In the supply step, the voltage may be converted by the voltage converter such that a current value of the current flowing through the first energy storage apparatus becomes less than or equal to a predetermined value.

When the current breaking device is brought into the cutoff state, the surge voltage (a huge voltage instantaneously generated beyond a steady state) may be generated at the moment when the current breaking device is brought into the cutoff state due to an inductance component of an electric cable connected to the first energy storage apparatus. The large surge voltage can cause the failure in the power supply system. Because the surge voltage follows the magnitude of the current, in order to decrease the surge voltage, desirably the failure diagnosis is performed when the current (charge current or discharge current) flowing through the first energy storage apparatus is small.

According to the above failure diagnosis method, the voltage is converted by the voltage converter such that the current value of the current flowing through the first energy storage apparatus becomes less than or equal to the predetermined value, so that the current flowing through the first energy storage apparatus can be decreased. Thus, the surge voltage can be reduced.

(10) The moving body may be an electric automobile driven by an electric motor, the power supply system includes a second energy storage apparatus that supplies the power to the electric motor, and the power supply apparatus may be a charger to which an external power supply charging the first energy storage apparatus and the second energy storage apparatus is connected.

In addition to a first energy storage apparatus that supplies the power to the first electric load, the electric automobile, a plug-in hybrid vehicle, or the like includes the charger to which the external power supply charging the second energy storage apparatus supplying the power to the electric motor that is a drive source of the moving body and the first energy storage apparatus is connected.

When the external power supply is connected to the charger, the power can be supplied from the external power supply to the first electric load and the first energy storage apparatus. Thus, by performing the failure diagnosis when the external power supply is connected to the charger, the failure of the current breaking device can be performed while the power supply to the first electric load is continued.

(11) An energy storage apparatus mounted on a moving body including an electric load and a power supply apparatus, the energy storage apparatus includes: an energy storage device; a current breaking device connected in series with the energy storage device; a current sensor that measures a charge current of the energy storage device; and a management unit. The management unit executes: command processing for commanding the current breaking device to perform cutoff while power is supplied from the power supply apparatus to the electric load and the energy storage apparatus; and determination processing for measuring the charge current of the energy storage device using the current sensor while the cutoff is issued to the current breaking device, and determining presence or absence of failure of the current breaking device based on a measured current value.

According to the energy storage apparatus, the failure diagnosis of the current breaking device with continuing the power supply to the first electric load can be implemented while preventing the configuration of the power supply system from becoming complicated.

(12) An energy storage apparatus mounted on a moving body including an electric load and a power supply apparatus, the energy storage apparatus includes: an energy storage device; a current breaking device connected in series with the energy storage device; a current sensor that measures a discharge current of the energy storage device; and a management unit. The management unit includes: command processing for commanding the current breaking device to perform cutoff when power is supplied from the energy storage apparatus to the first electric load while keeping a state where power is supplied from the power supply apparatus to the electric load when the power is not supplied from the energy storage apparatus to the electric load; and determination processing for measuring the discharge current of the energy storage device using the current sensor while the cutoff is issued to the current breaking device, and determining presence or absence of failure of the current breaking device based on a measured current value.

According to the energy storage apparatus, the failure diagnosis of the current breaking device with continuing the power supply to the first electric load can be implemented while preventing the configuration of the power supply system from becoming complicated.

The invention disclosed in the present specification can be implemented in various modes such as a device, a method, a computer program implementing the function of the device or the method, and a recording medium in which the computer program is recorded.

First Embodiment

With reference to FIGS. 1 to 6, a first embodiment will be described. In the following description, part of reference numerals of the drawings may be omitted for the same components.

(1) Power Supply System of Vehicle

A vehicle 1 (an example of a moving body) in FIG. 1 is an electric automobile. An electric motor 10 that is a vehicle drive source, a first electric load 11, a power supply system 12, a vehicle engine control unit (ECU) (not illustrated), and the like are mounted on the vehicle 1. The first electric load 11 is rated at 12 V, and examples of the first electric load 11 include a brake, a door lock, a car navigation system, and an immobilizer.

Figure 2:
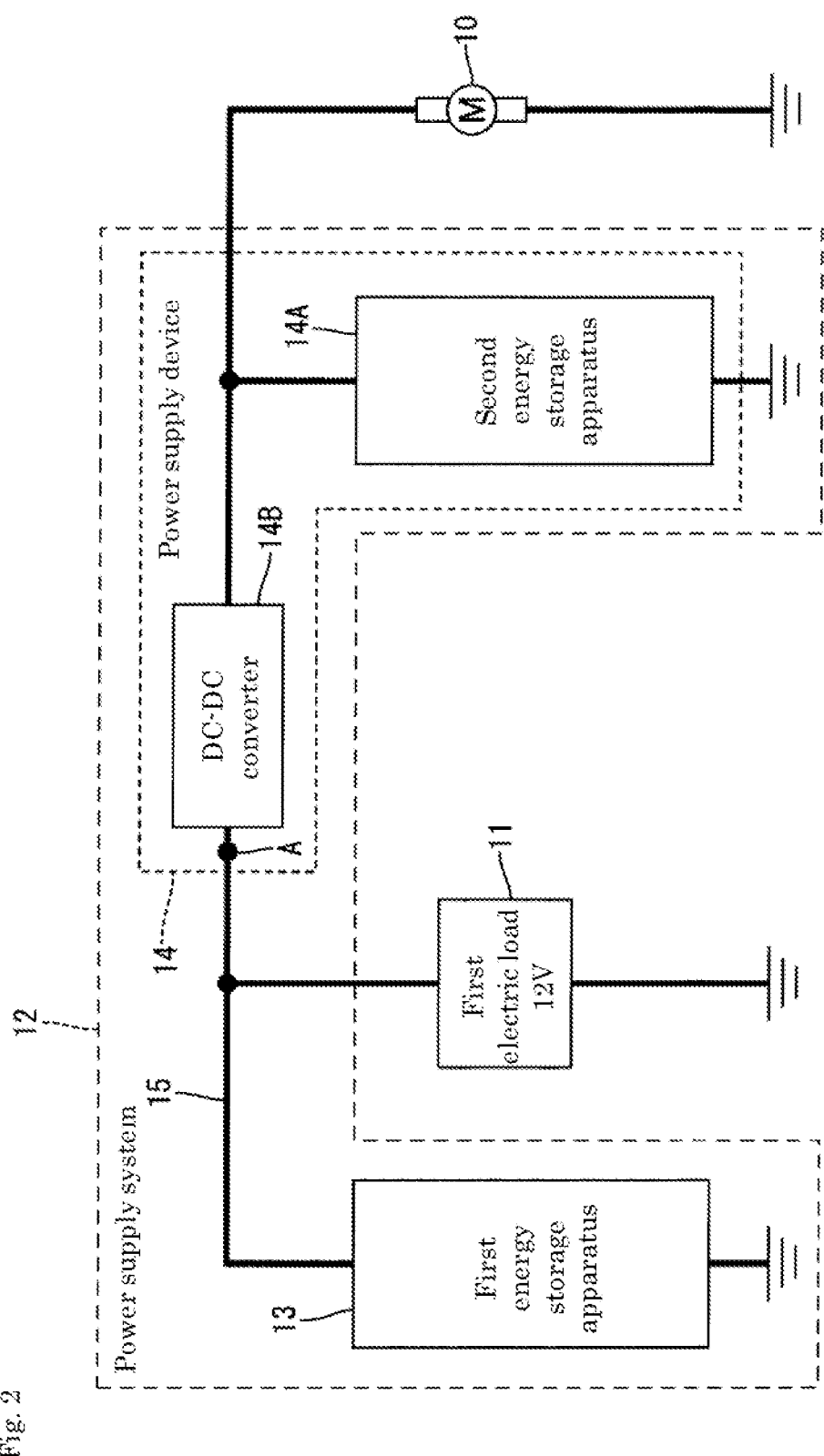
FIG. 2 is a block diagram of a power supply system.

As illustrated in FIG. 2, the power supply system 12 includes a first energy storage apparatus 13 (an example of an energy storage apparatus) and a power supply apparatus 14. The first energy storage apparatus 13 and the power supply apparatus 14 are connected in parallel. The first energy storage apparatus 13 supplies power to the first electric load 11. The power supply apparatus 14 supplies power to the first energy storage apparatus 13, the first electric load 11, and the electric motor 10.

The first energy storage apparatus 13 is connected to the first electric load 11 through a power line 15. The first energy storage apparatus 13 is rated at 12 V.

The power supply apparatus 14 includes a second energy storage apparatus 14A having a high voltage (for example, 100 V) and a DC-DC converter 14B (an example of the voltage converter). The second energy storage apparatus 14A supplies power to the first energy storage apparatus 13, the electric motor 10, and the first electric load 11. The DC-DC converter 14B is connected between the first electric load 11 and the second energy storage apparatus 14A. The DC-DC converter 14B has a variable voltage after conversion, and converts the voltage applied from the second energy storage apparatus 14A into an output voltage instructed from the first energy storage apparatus 13.

(2) Configuration of Energy Storage Apparatus

Because the configuration of the first energy storage apparatus 13 and the configuration of the second energy storage apparatus 14A are substantially the same, the first energy storage apparatus 13 will be described here as an example.

Figure 3:
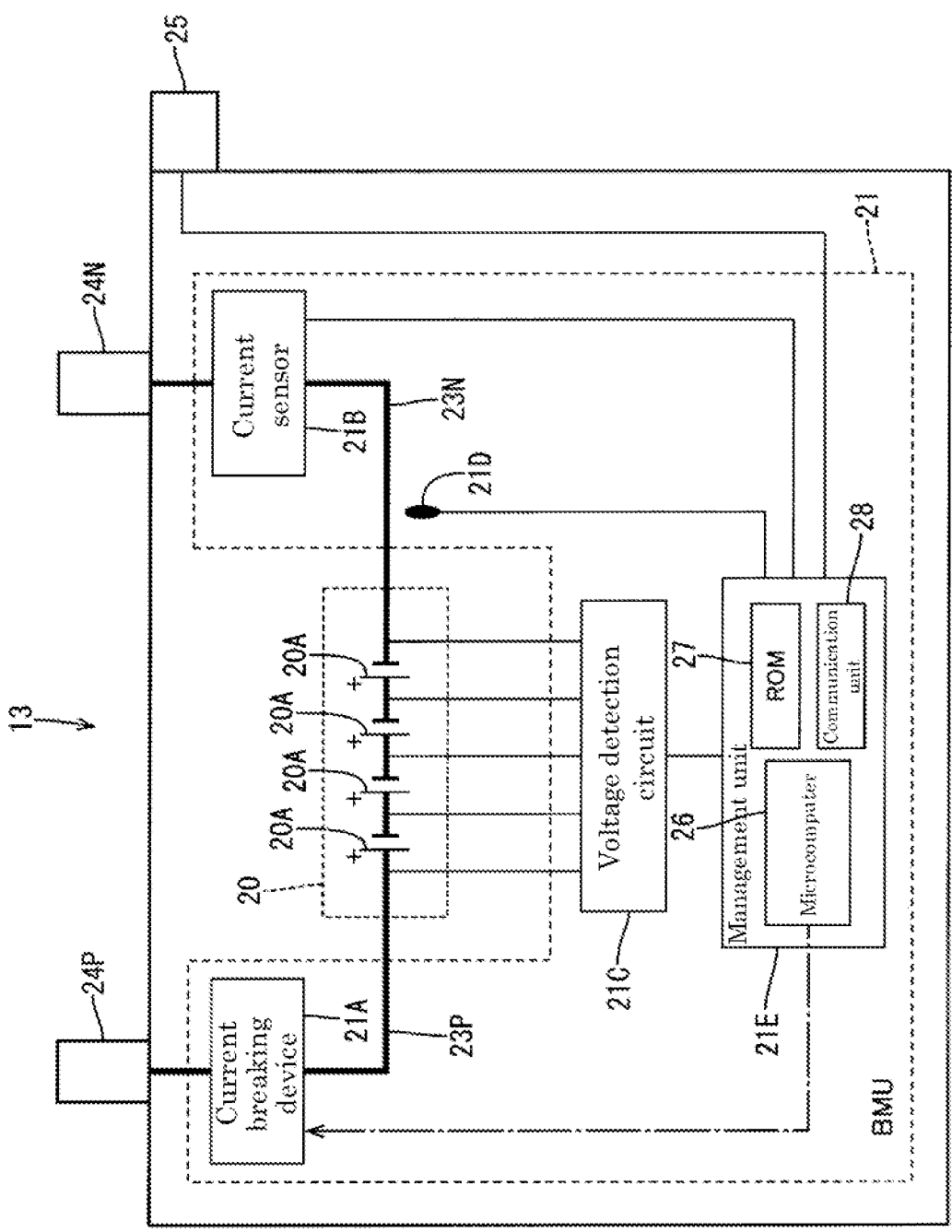
FIG. 3 is a block diagram of a first energy storage apparatus.

As illustrated in FIG. 3, the first energy storage apparatus 13 includes an assembled battery 20, a battery management unit (BMU) 21, and a communication connector 25. In the assembled battery 20, twelve secondary batteries 20A (an example of an energy storage device) are connected in three parallel and four series. In FIG. 3, three secondary batteries 20A connected in parallel are represented by one battery symbol. The secondary battery 20A is, for example, a lithium ion secondary battery.

The BMU 21 includes a current breaking device 21A, a current sensor 21B, a voltage detection circuit 21C, a temperature sensor 21D, and a management unit 21E. The voltage detection circuit 21C and the management unit 21E are mounted on a circuit board unit 65 (see FIG. 4).

The current breaking device 21A, the assembled battery 20, and the current sensor 21B are connected in series through power lines 23P, 23N. The power line 23P is a power line that connects an external terminal 24P of a positive electrode and a positive electrode of the assembled battery 20. The power line 23N connects an external terminal 24N of a negative electrode and a negative electrode of the assembled battery 20. The current breaking device 21A is located on the positive electrode side of the assembled battery 20 and is provided in the power line 23P on the positive electrode side. The current sensor 21B is located on the negative electrode side of the assembled battery 20 and is provided in the power line 23N of the negative electrode.

The current breaking device 21A can be constructed of a contact switch (mechanical type) such as a relay or a semiconductor switch such as an FET or a transistor. The current breaking device 21A is switched between a cutoff state and a conduction state (open/close, off/on) by the management unit 21E. When the current breaking device 21A is brought into the cutoff state, the first energy storage apparatus 13 is disconnected from the power line 15 of the vehicle 1, and the current is cut off. When the current breaking device 21A is in the conduction state, the first energy storage apparatus 13 is connected to the power line 15, and the power can be supplied to the first electric load 11.

The current sensor 21B measures a charge-discharge current [A] of the assembled battery 20 and outputs the charge-discharge current to the management unit 21E.

The voltage detection circuit 21C is connected to both ends of each secondary battery 20A by a signal line. The voltage detection circuit 21C measures a battery voltage [V] of each secondary battery 20A and outputs the battery voltage to the management unit 21E. A total voltage [V] of the assembled battery 20 is a total voltage of the four secondary batteries 20A connected in series.

The temperature sensor 21D is a contact type or a non-contact type, measures a temperature [° C.] of the secondary battery 20A, and outputs the temperature to the management unit 21E. Although not illustrated in FIG. 3, at least two temperature sensors 21D are provided. Each temperature sensor 21D detects a different temperature of the secondary battery 20A.

The management unit 21E includes a microcomputer 26, in which a CPU, a RAM, and the like are integrated into one chip, a ROM 27, and a communication unit 28. The ROM 27 stores various programs and data. The microcomputer 26 manages the first energy storage apparatus 13 by executing the program stored in the ROM 27.

The communication unit 28 is a communication circuit for causing the management unit 21E to communicate with the vehicle ECU and the DC-DC converter 14B. The management unit 21E and the DC-DC converter 14B may communicate with each other through the vehicle ECU, or directly communicate without the vehicle ECU.

The communication connector 25 is a connector to which a communication cable (not illustrated), through which the management unit 21E communicates with the vehicle ECU, is connected. When the management unit 21E and the DC-DC converter 14B directly communicate with each other, a communication cable through which the management unit 21E communicates with the DC-DC converter 14B is connected.

Figure 4:
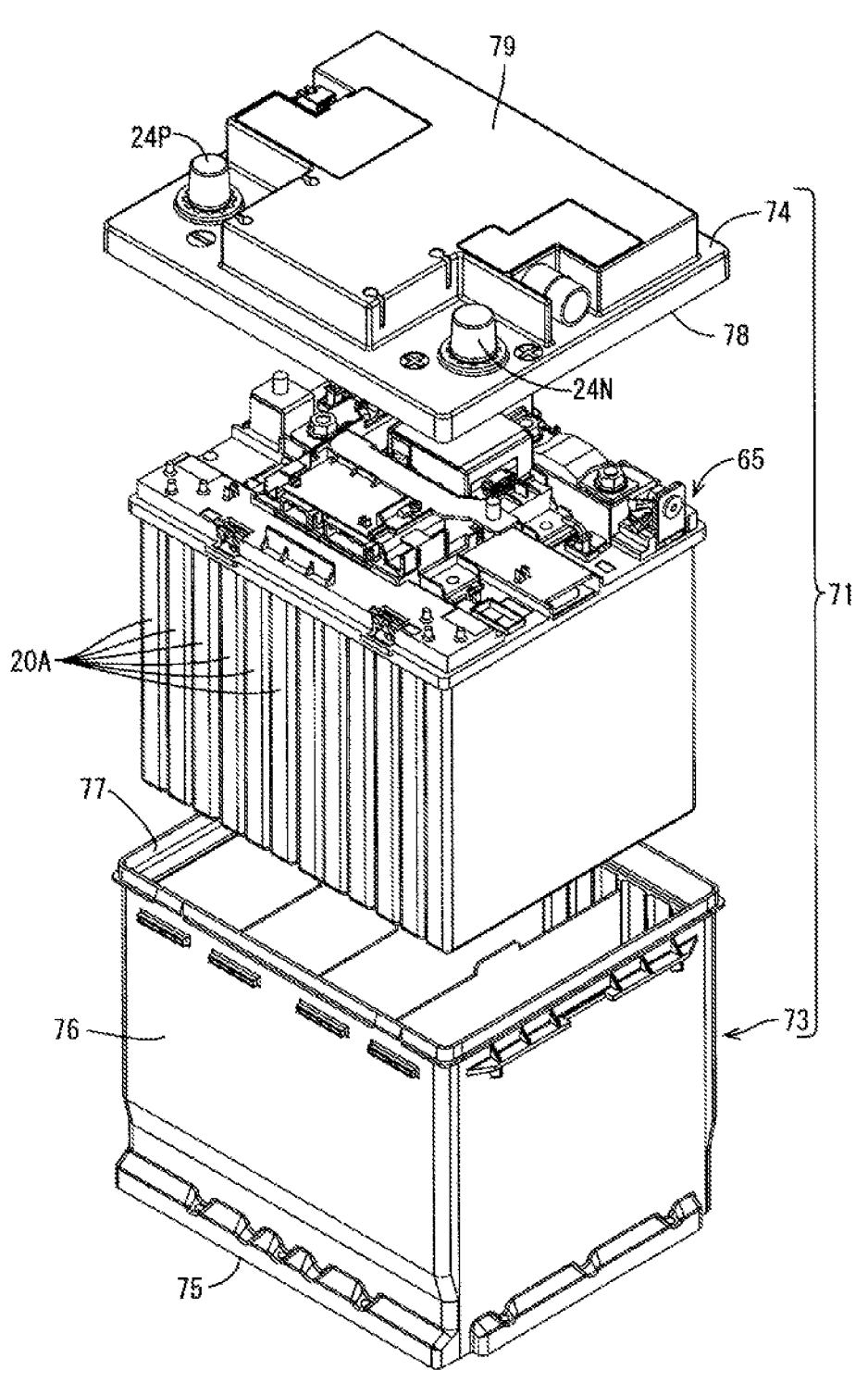
FIG. 4 is an exploded perspective view of an energy storage apparatus.

As illustrated in FIG. 4, the first energy storage apparatus 13 includes a container 71. The container 71 includes a main body 73 and a lid body 74 that are made of a synthetic resin material. The main body 73 has a bottomed cylindrical shape. The main body 73 includes a bottom surface 75 and four side surfaces 76. An upper opening 77 is formed at an upper end portion by the four side surfaces 76.

The container 71 accommodates the assembled battery 20 and the circuit board unit 65. The circuit board unit 65 is disposed above the assembled battery 20.

The lid body 74 closes the upper opening 77 of the main body 73. An outer peripheral wall 78 is provided around the lid body 74. The lid body 74 includes a protrusion 79 having a substantially T-shape in planar view. The external terminal 24P of the positive electrode is fixed to one corner of a front of the lid body 74, and the external terminal 24N of the negative electrode is fixed to the other corner.

Figure 5A:
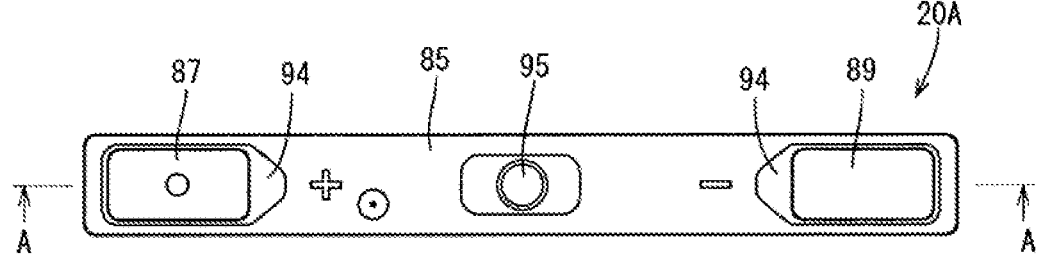
FIG. 5A is a plan view of a secondary battery.
Figure 5B:
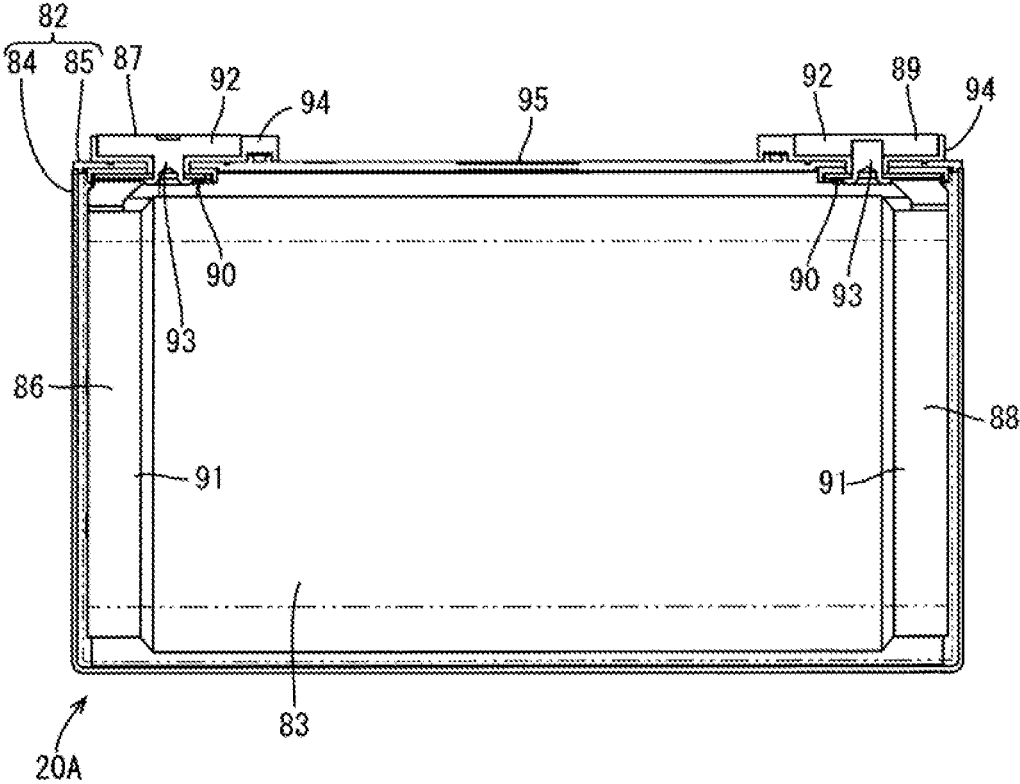
FIG. 5B is a sectional view taken along line A-A in FIG. 5A.

As illustrated in FIGS. 5A and 5B, in the secondary battery 20A, an electrode assembly 83 is accommodated in a rectangular parallelepiped case 82 together with a non-aqueous electrolyte. The case 82 includes a case body 84 and a lid 85 that closes an opening above the case body 84.

Although not illustrated in detail, in the electrode assembly 83, a separator formed of a porous resin film is disposed between a negative electrode element in which an active material is applied to a base material formed of a copper foil and a positive electrode element in which an active material is applied to a base material formed of an aluminum foil. These are wound in a flat shape so as to be accommodated in the case body 84 in the state where the negative electrode element and the positive electrode element are displaced to opposite sides in the width direction while the positions are disposed with respect to the separator.

A positive electrode terminal 87 is connected to the positive electrode element through a positive electrode current collector 86, and a negative electrode terminal 89 is connected to the negative electrode element through a negative electrode current collector 88. Each of the positive electrode current collector 86 and the negative electrode current collector 88 includes a flat plate-shaped pedestal 90 and a leg 91 extending from the pedestal 90. A through-hole is made in the pedestal 90. The leg 91 is connected to positive electrode element or the negative electrode element. Each of the positive electrode terminal 87 and the negative electrode terminal 89 includes a terminal body 92 and a shaft 93 protruding downward from a center portion of a lower surface of the terminal body 92. The terminal body 92 and the shaft 93 of the positive electrode terminal 87 are integrally formed of aluminum (single material). In the negative electrode terminal 89, the terminal body 92 is made of aluminum, and the shaft 93 is made of copper, and the terminal body 92 and the shaft 93 are assembled. The terminal bodies 92 of the positive electrode terminal 87 and the negative electrode terminal 89 are disposed at both ends of the lid 85 through a gasket 94 made of an insulating material, and are exposed outward from the gasket 94.

As illustrated in FIG. 5A, the lid 85 includes a pressure release valve 95. The pressure release valve 95 is located between the positive electrode terminal 87 and the negative electrode terminal 89. When internal pressure of the case 82 exceeds a limit value, the pressure release valve 95 is released to lower the internal pressure of the case 82.

(3) Processing Performed by BMU

Processing for protecting the first energy storage apparatus executed by the BMU 21 of the first energy storage apparatus 13 and failure diagnosis processing for diagnosing the failure of the current breaking device 21A will be described.

(3-1) Processing for Protecting First Energy Storage Apparatus

With reference to FIG. 3, the processing for protecting the first energy storage apparatus will be described. The processing for protecting the first energy storage apparatus is processing for monitoring the state of the first energy storage apparatus 13 and, when an abnormality is detected, instructing the current breaking device 21A to perform the cutoff to protect the first energy storage apparatus 13 from the abnormality. Specifically, the abnormality of the first energy storage apparatus 13 is overcharge, overdischarge, overcurrent, temperature abnormality, or the like. The detection of the abnormality will be described below.

The BMU 21 measures a current value at a constant period using the current sensor 21B, and estimates a state of charge (SOC) by a current integration method. The current integration method is a method for measuring the amount of power flowing in and out of the assembled battery 20 by constantly measuring the charge-discharge current of the assembled battery 20 by the current sensor 21B, and estimating the SOC by adding or subtracting the power amount from the initial capacity. The BMU 21 determines that the battery is overcharged when the estimated SOC is larger than a predetermined upper limit value, and determines that the battery is overdischarged when the estimated SOC is smaller than a predetermined lower limit value.

Here, the case where the overcharge or overdischarge is determined from the SOC estimated by the current integration method has been described as an example. The determination may be made from a voltage value measured by the voltage detection circuit 21C. Specifically, because an open circuit voltage (OCV) of the first energy storage apparatus 13 and the SOC have a relatively accurate correlation, it may be determined as the overcharge when the voltage measured by the voltage detection circuit 21C is greater than or equal to a predetermined upper limit voltage, and it may be determined as the overdischarge when the voltage is less than or equal to a predetermined lower limit voltage. Generally, the OCV is a voltage when the circuit is open; however, here, a voltage when the circuit is not open and the charge-discharge current of the first energy storage apparatus 13 is less than or equal to a minute reference value (for example, 10 mA) is defined as the OCV.

Each time the current value is measured by the current sensor 21B, the BMU 21 determines whether the measured current value is greater than or equal to a predetermined value, and determines that it is the overcurrent when the measured current value is greater than or equal to the predetermined value. An external short circuit can be exemplified as the cause of the overcurrent.

The BMU 21 measures the temperature of the secondary battery 20A at a constant period using the temperature sensor 21D, and determines that there is a temperature abnormality when the measured temperature is greater than or equal to a predetermined value.

In this case, the overcharge, overdischarge, overcurrent, and temperature abnormality have been described as examples of the abnormality of the secondary battery 20A. The abnormality of the secondary battery 20A is not limited thereto. For example, a failure may take place in the current sensor 21B, the voltage detection circuit 21C, the temperature sensor 21D, and the like.

(3-2) Processing for Diagnosing Failure of Current Breaking Device

The processing for diagnosing the failure of the current breaking device is for determining whether there is a failure in the current breaking device 21A. The failure diagnosis processing can be performed either when the first energy storage apparatus 13 is being charged or when the first power storage apparatus 13 is being discharged. In the first embodiment, the case where the first power storage apparatus 13 is being charged will be described as an example.

With reference to FIG. 2, an outline of the failure diagnosis processing will be described. Although the timing to start the processing can be determined as appropriate, in the first embodiment, the case where the processing is started when the vehicle 1 is stopped or parked will be described as an example.

The BMU 21 instructs the DC-DC converter 14B to supply power from the power supply apparatus 14 to the first electric load 11 and the first energy storage apparatus 13 when the vehicle 1 is stopped or parked. Specifically, the BMU 21 instructs the DC-DC converter 14B to convert the voltage applied from the second energy storage apparatus 14A to the voltage higher than the current voltage (OCV) of the first energy storage apparatus 13. The DC-DC converter 14B converts the voltage applied from the second energy storage apparatus 14A into an output voltage instructed from the BMU 21. Thus, the voltage at a point A becomes higher than the voltage of the first energy storage apparatus 13. When the voltage at the point A becomes higher than the voltage of the first energy storage apparatus 13, the power is supplied from the power supply apparatus 14 to the first electric load 11 and the first energy storage apparatus 13 (an example of the supply step).

Because the power is supplied from the power supply apparatus 14 to the first energy storage apparatus 13, a charge current flows through the first energy storage apparatus 13. The BMU 21 commands the current breaking device 21A to perform the cutoff while the charge current flows in the first energy storage apparatus 13 (an example of the command step and the command processing). When the cutoff is issued to the current breaking device 21A, the charge current does not flow because the current breaking device 21A is in the cutoff state in the case where the current breaking device 21A does not fail. When the charge current does not flow, the BMU 21 determines that the current breaking device 21A does not fail (an example of the determination step and the determination processing). Because the power is supplied from the power supply apparatus 14 to the first electric load 11, the power supply to the first electric load 11 is continued even when the current breaking device 21A becomes the cutoff state.

On the other hand, when the current breaking device 21A fails, the conduction state is maintained, so that the charge current continues to flow through the first energy storage apparatus 13. When the charge current continues to flow, the BMU 21 determines that the current breaking device 21A fails (an example of the determination step and the determination processing).

When the difference between the voltage of the first energy storage apparatus 13 and the voltage converted by the DC-DC converter 14B is large, the charge current flowing through the first energy storage apparatus 13 increases. When the charge current is large, a large surge voltage is generated when the current breaking device 21A is brought into the cutoff state. For this reason, the voltage instructed to the DC-DC converter 14B by the BMU 21 is desirably the voltage at which the current value of the charge current flowing through the first energy storage apparatus 13 is less than or equal to a predetermined value. For example, when the voltage (OCV) of the first energy storage apparatus 13 is 14.0 V, the output voltage instructed to the DC-DC converter 14B is desirably about 14.1 V that is higher by 0.1 V.

In the above description, when the output voltage is instructed to the DC-DC converter 14B, the voltage is converted by the DC-DC converter 14B and the power is supplied to the first electric load 11 and the first energy storage apparatus 13. However, there is the case where the power is not supplied to the first electric load 11 and the first energy storage apparatus 13 due to the failure of the DC-DC converter 14B, the failure of the second energy storage apparatus 14A, the disconnection of the power line 15, or the like.

Figure 6:
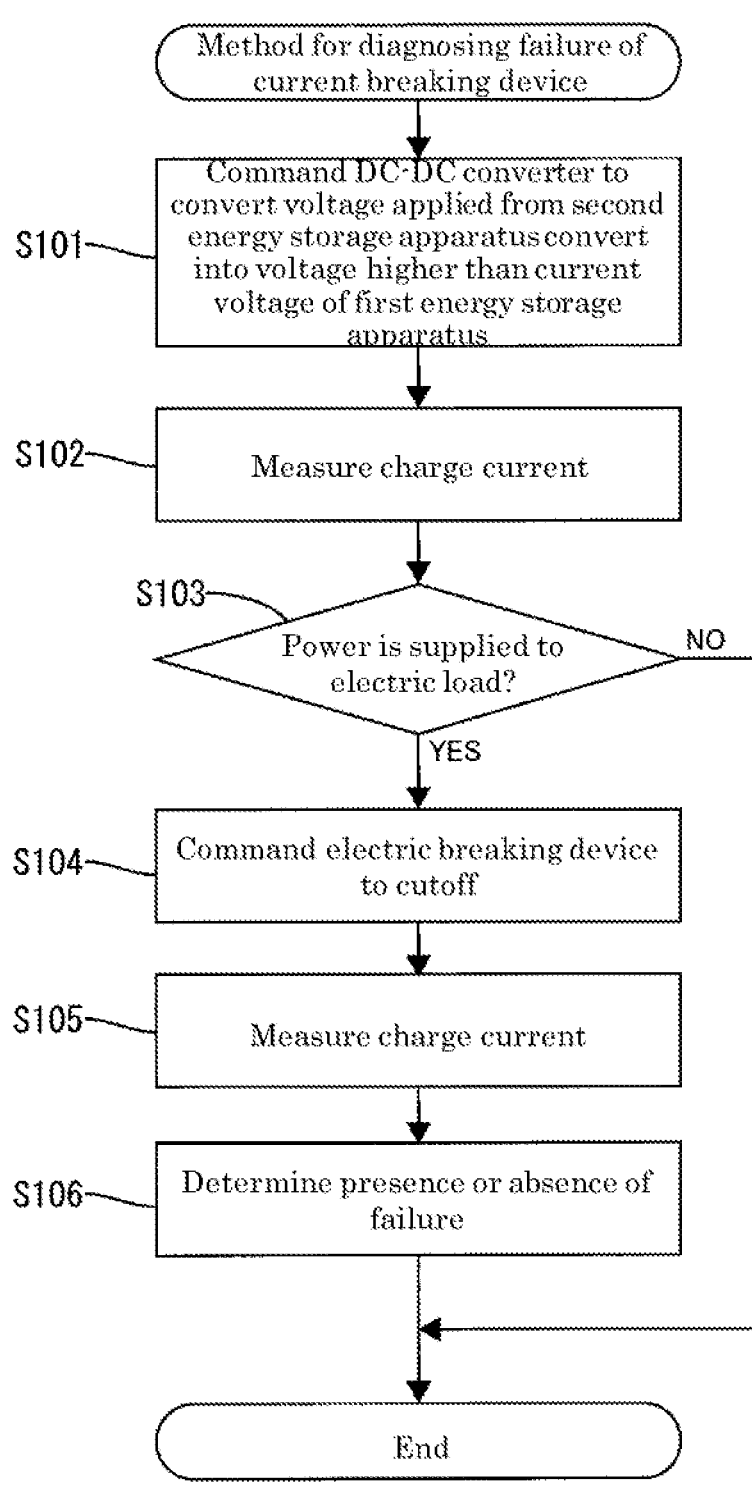
FIG. 6 is a flowchart of failure diagnosis processing.

With reference to FIG. 6, a flow of the failure diagnosis processing will be described.

In S101, the BMU 21 instructs the DC-DC converter 14B to convert the voltage applied from the second energy storage apparatus 14A into the voltage higher than the current voltage of the first energy storage apparatus 13.

In S102, the BMU 21 measures the charge current using the current sensor 21B.

In S103, the BMU 21 determines whether the power is supplied from the power supply apparatus 14 to the first electric load 11 from the current value measured in S102 (an example of the charge determination step). Specifically, the BMU 21 determines whether the charge current is flowing through the first energy storage apparatus 13. When the charge current is flowing through the first energy storage apparatus 13, it can be determined that the DC-DC converter 14B and the like does not fail but that the power is supplied from the power supply apparatus 14 to the first electric load 11. Thus, the BMU 21 determines whether the charge current flows, thereby determining whether the power is supplied from the power supply apparatus 14 to the first electric load 11.

When the current value (the current value of the charge current) measured in S102 is greater than or equal to the predetermined value (when the charge current flows), the BMU 21 determines that the power is supplied from the second energy storage apparatus 14A to the first electric load 11, and proceeds to S104. When the current value is less than the predetermined value (when the charge current does not flow), the BMU 21 determines that the power is not supplied from the second energy storage apparatus 14A to the first electric load 11, and ends the processing in order to avoid the power failure.

In S104, the BMU 21 instructs the current breaking device 21A to perform the cutoff.

In S105, the BMU 21 measures the charge current using the current sensor 21B.

In S106, the BMU 21 determines whether there is the failure in the current breaking device 21A from the current value measured in S105. Specifically, the BMU 21 determines that the current breaking device 21A fails when the measured current value is greater or equal to a predetermined value (when the current is not cut off), and determines that the current breaking device does not fail when the measured current value is less than the predetermined value (when the current is cut off).

(4) Effect of First Embodiment

According to the failure diagnosis method of the first embodiment, because the component such as the switch circuit described in Patent Document 1 is not required to be included, the failure diagnosis of the current breaking device 21A with continuing the power supply to the first electric load 11 can be implemented while preventing the configuration of the power supply system 12 from becoming complicated. In other words, the failure of the current breaking device 21A can be diagnosed while preventing the power failure, suppressing the complication of the configuration of the power supply system 12. According to the failure diagnosis method of the first embodiment, the failure diagnosis can be performed when the first energy storage apparatus 13 is being charged.

According to the failure diagnosis method of the first embodiment, the current breaking device 21A is instructed to perform the cutoff after the power is supplied from the power supply apparatus 14 to the first electric load 11, so that the power failure can be further prevented.

According to the failure diagnosis method of the first embodiment, the voltage at point A is made higher than the voltage of the first energy storage apparatus 13 by the DC-DC converter 14B, so that the failure of the current breaking device 21A can be diagnosed while the power supply to the first electric load 11 is continued.

According to the failure diagnosis method of the first embodiment, the voltage is converted by the DC-DC converter 14B such that the current value of the charge current flowing through the first energy storage apparatus 13 becomes less than or equal to the predetermined value, so that the charge current flowing through the first energy storage apparatus 13 can be reduced. Thus, the surge voltage can be reduced.

According to the energy storage apparatus of the first embodiment, the failure diagnosis of the current breaking device 21A with continuing the power supply to the first electric load 11 can be implemented while preventing the configuration of the power supply system 12 from becoming complicated.

Second Embodiment

The configuration of the power supply system 12 according to a second embodiment is substantially the same as the configuration of the power supply system 12 according to the first embodiment. The BMU 21 of the second embodiment executes the failure diagnosis processing when the first energy storage apparatus 13 discharges.

(1) Processing for Diagnosing Failure of Current Breaking Device

With reference to FIG. 2, an outline of the failure diagnosis processing of the second embodiment will be described. The BMU 21 supplies the power from the first energy storage apparatus 13 to the first electric load 11 in the state where the power is supplied from the power supply apparatus 14 to the first electric load 11 when the power is not supplied from the first energy storage apparatus 13 to the first electric load 11 while the vehicle 1 is stopped or parked.

Specifically, the BMU 21 instructs the DC-DC converter 14B to convert the voltage at point A into the voltage lower than the voltage of the first energy storage apparatus 13 and greater than or equal to the operating voltage of the first electric load 11. Thus, the voltage at point A becomes lower than the voltage of the first energy storage apparatus 13. When the voltage at point A becomes lower than the voltage of the first energy storage apparatus 13, the power is supplied from the first energy storage apparatus 13 to the first electric load 11 (an example of the supply step). Thus, the discharge current flows from the first energy storage apparatus 13.

In this case, the case where the voltage applied to the DC-DC converter 14B is instructed to be converted into the voltage lower than the voltage of the first energy storage apparatus 13 has been described as an example. However, the voltage may be instructed to be converted into the same voltage as the voltage of the first energy storage apparatus 13. When the voltage of the first energy storage apparatus 13 and the voltage at point A are the same, the power is supplied from the first energy storage apparatus 13 and the power supply apparatus 14 to the first electric load 11.

The BMU 21 commands the current breaking device 21A to perform the cutoff while the discharge current flows in the first energy storage apparatus 13 (an example of the command step and the command processing). When the cutoff is issued to the current breaking device 21A, the discharge current does not flow because the current breaking device 21A is in the cutoff state in the case where the current breaking device 21A does not fail. When the discharge current does not flow, the BMU 21 determines that the current breaking device 21A does not fail (an example of the determination step and the determination processing). When the current breaking device 21A becomes the cutoff state, the power is not supplied from the first energy storage apparatus 13 to the first electric load 11. However, the voltage at point A is greater than or equal to the operating voltage of the first electric load 11, so that the power is supplied from the power supply apparatus 14 to the first electric load 11 instead of the first energy storage apparatus 13. Thus, the power supply to the first electric load 11 is continued.

On the other hand, when the current breaking device 21A fails, the conduction state is maintained, so that the discharge current continues to flow from the first energy storage apparatus 13. When the discharge current continues to flow, the BMU 21 determines that the current breaking device 21A fails (an example of the determination step and the determination processing).

When the difference between the voltage of the first energy storage apparatus 13 and the voltage converted by the DC-DC converter 14B is large, the discharge current flowing through the first energy storage apparatus 13 increases. When the discharge current is large, the large surge voltage is generated when the current breaking device 21A is brought into the cutoff state. For this reason, the output voltage instructed to the DC-DC converter 14B is desirably the voltage at which the current value of the discharge current flowing through the first energy storage apparatus 13 is less than or equal to a predetermined value. For example, assuming that the voltage of the first energy storage apparatus 13 is 14.0 V and that the operating voltage of the first electric load 11 is 12.0 V, the output voltage instructed to the DC-DC converter 14B is desirably about 13.9 V that is lower than 14.0 V by 0.1 V.

In the above description, it has been described that the voltage is converted by the DC-DC converter 14B when the output voltage is instructed to the DC-DC converter 14B, however, the DC-DC converter 14B may not become the state of being able to convert the voltage due to the failure of the DC-DC converter 14B or the like.

Figure 7:
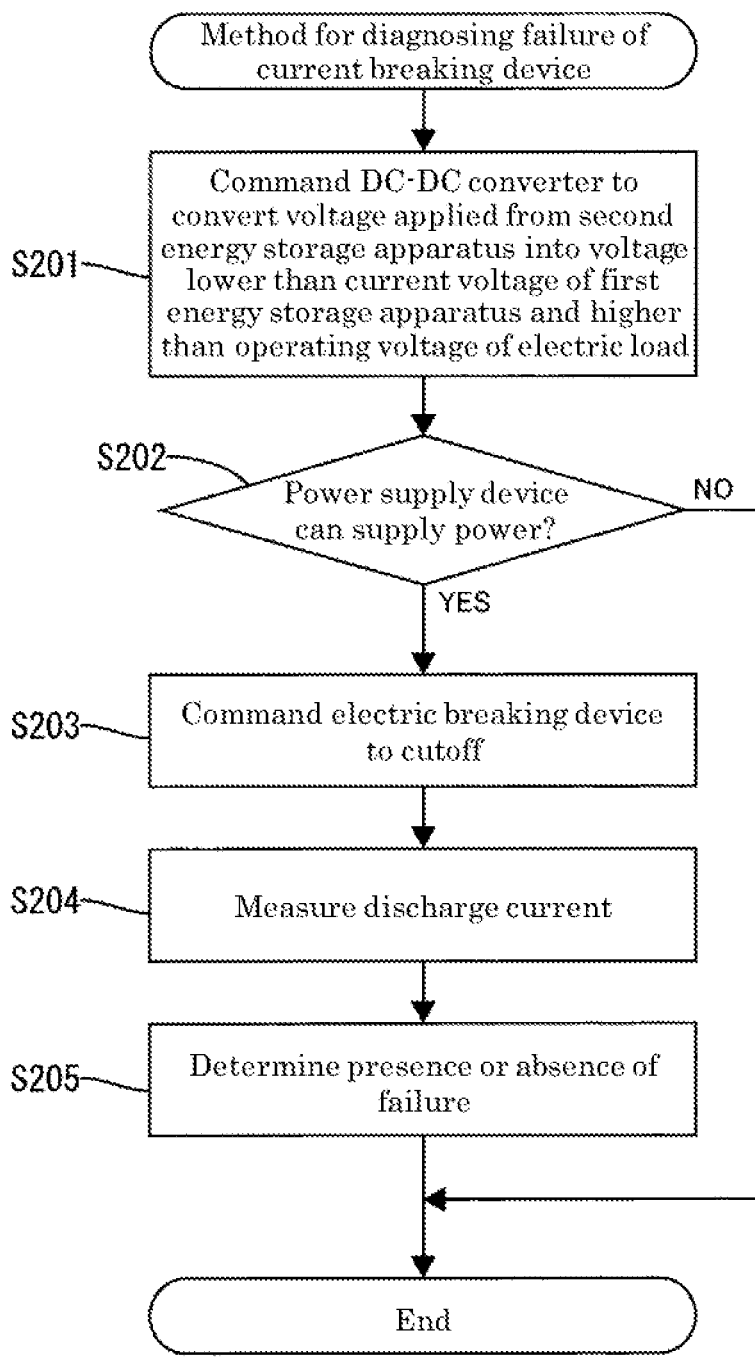
FIG. 7 is a flowchart illustrating failure diagnosis processing according to a second embodiment.

With reference to FIG. 7, a flow of the failure diagnosis processing of the second embodiment will be described.

In S201, the BMU 21 instructs the DC-DC converter 14B to convert the voltage applied from the second energy storage apparatus 14A into the voltage that is lower than the current voltage of the first energy storage apparatus 13 and higher than the operating voltage of the first electric load 11.

In S202, the BMU 21 communicates with the DC-DC converter 14B, and determines whether the power supply apparatus 14 is in the state capable of supplying the power (an example of the supply determination step). Specifically, the BMU 21 inquires of the DC-DC converter 14B whether the voltage applied from the second energy storage apparatus 14A can be converted into the output voltage instructed from the BMU 21. The BMU 21 proceeds to S203 when the conversion can be performed, and ends the processing in order to avoid the power fail when the conversion cannot be performed.

In S203, the BMU 21 commands the current breaking device 21A to perform the cutoff.

In S204, the BMU 21 measures the discharge current using the current sensor 21B.

In S205, the BMU 21 determines whether there is the failure in the current breaking device 21A from the current value measured in S204. Specifically, the BMU 21 determines that the current breaking device 21A fails when the measured current value is greater or equal to a predetermined value (when the current is not cut off), and determines that the current breaking device does not fail when the measured current value is less than the predetermined value (when the current is cut off).

(2) Effect of First Embodiment

According to the failure diagnosis method of the second embodiment, because the component such as the switch circuit described in Patent Document 1 is not required to be included, the failure diagnosis of the current breaking device 21A with continuing the power supply to the first electric load 11 can be implemented while preventing the configuration of the power supply system 12 from becoming complicated.

According to the failure diagnosis method of the second embodiment, when the current breaking device 21A is in the cutoff state and when the power supply from the first energy storage apparatus 13 to the first electric load 11 is stopped, the command step is executed after checking that the power is supplied from the power supply apparatus 14 to the first electric load 11, so that the power failure can be more reliably prevented.

According to the failure diagnosis method of the second embodiment, the voltage at point A is made lower than the voltage of the first energy storage apparatus 13 by the DC-DC converter 14B, so that the failure of the current breaking device 21A can be diagnosed while the power supply to the first electric load 11 is continued.

According to the failure diagnosis method of the second embodiment, the voltage is converted by the DC-DC converter 14B such that the current value of the discharge current flowing from the first energy storage apparatus 13 becomes less than or equal to the predetermined value, so that the discharge current flowing from the first energy storage apparatus 13 can be reduced. Thus, the surge voltage can be reduced.

According to the energy storage apparatus of the second embodiment, the failure diagnosis of the current breaking device 21A with continuing the power supply to the first electric load 11 can be implemented while preventing the configuration of the power supply system 12 from becoming complicated.

Third Embodiment

A third embodiment is a modification of the first embodiment.

(1) Configuration of Power Supply System

Figure 8:
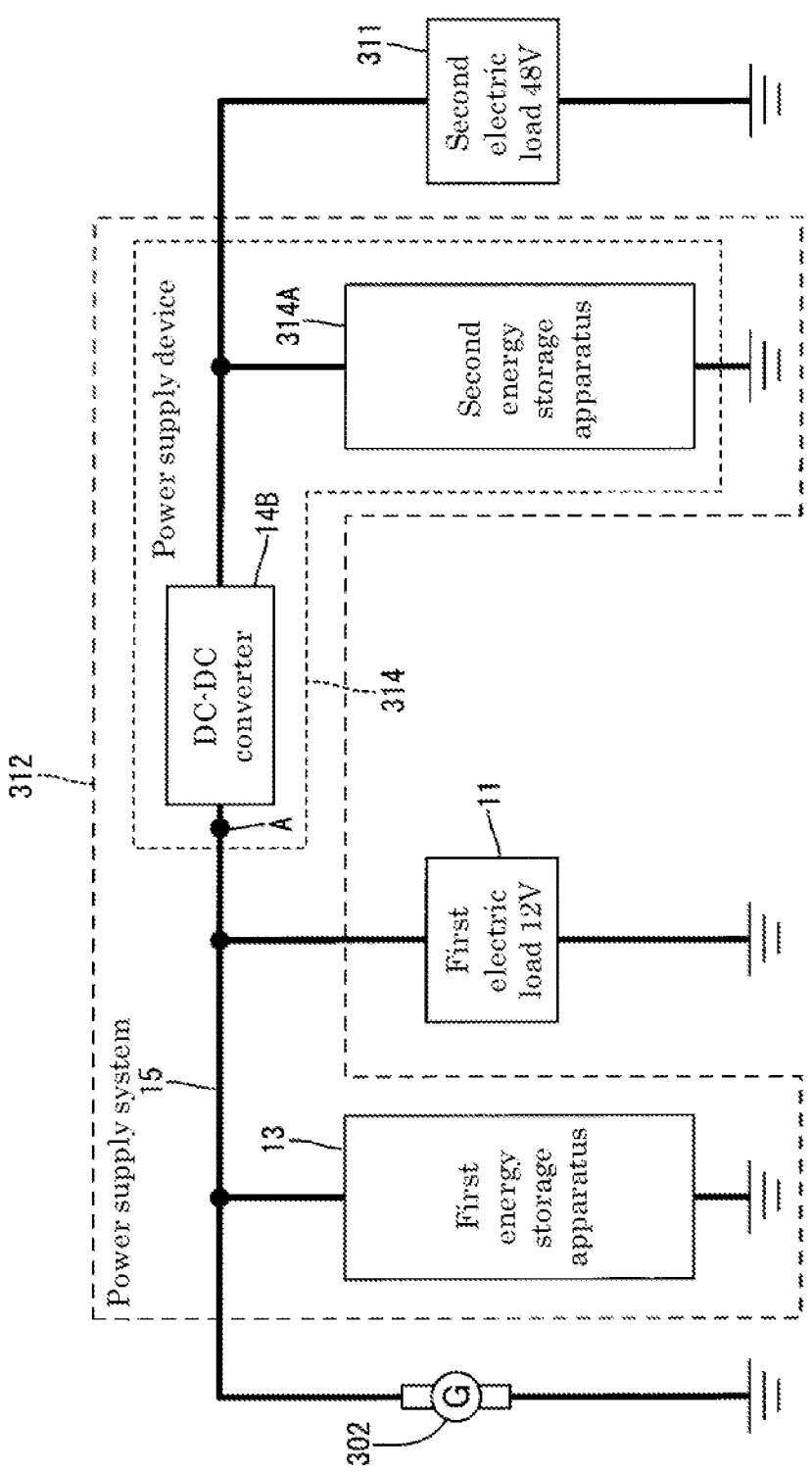
FIG. 8 is a block diagram illustrating a power supply system according to a third embodiment.

With reference to FIG. 8, the configuration of the power supply system 12 according to a third embodiment will be described. The vehicle 1 of the third embodiment is an engine automobile, and includes a generator 302 (alternator) using an engine as a power source. The first electric load 11 of the third embodiment also includes an engine starting device such as a cell motor.

The vehicle 1 of the third embodiment includes a 48 V-system second electric load 311 separately from the 12 V-system first electric load 11. The power supply apparatus 314 of the third embodiment includes the DC-DC converter 14B and a second energy storage apparatus 314A. The second energy storage apparatus 314A is rated at 48 V, and supplies the power to the first electric load 11, the first energy storage apparatus 13, and the second electric load 311. The second energy storage apparatus 314A and the DC-DC converter 14B are examples of the power supply apparatus.

(2) Processing for Diagnosing Failure of Current Breaking Device

The failure diagnosis processing of the third embodiment is executed when the first energy storage apparatus 13 is charged by the second energy storage apparatus 314A. Because the failure diagnosis processing of the third embodiment is substantially the same as the failure diagnosis processing of the first embodiment except that the second energy storage apparatus 314A is 48 V, the description thereof will be omitted.

(3) Effect of First Embodiment

According to the failure diagnosis method of the third embodiment, the voltage at point A is made higher than the voltage of the first energy storage apparatus 13 by the DC-DC converter 14B, so that the failure of the current breaking device 21A can be diagnosed while the power supply to the first electric load 11 is continued.

Fourth Embodiment

A fourth embodiment is a modification of the first embodiment.

(1) Configuration of Power Supply System

Figure 9:
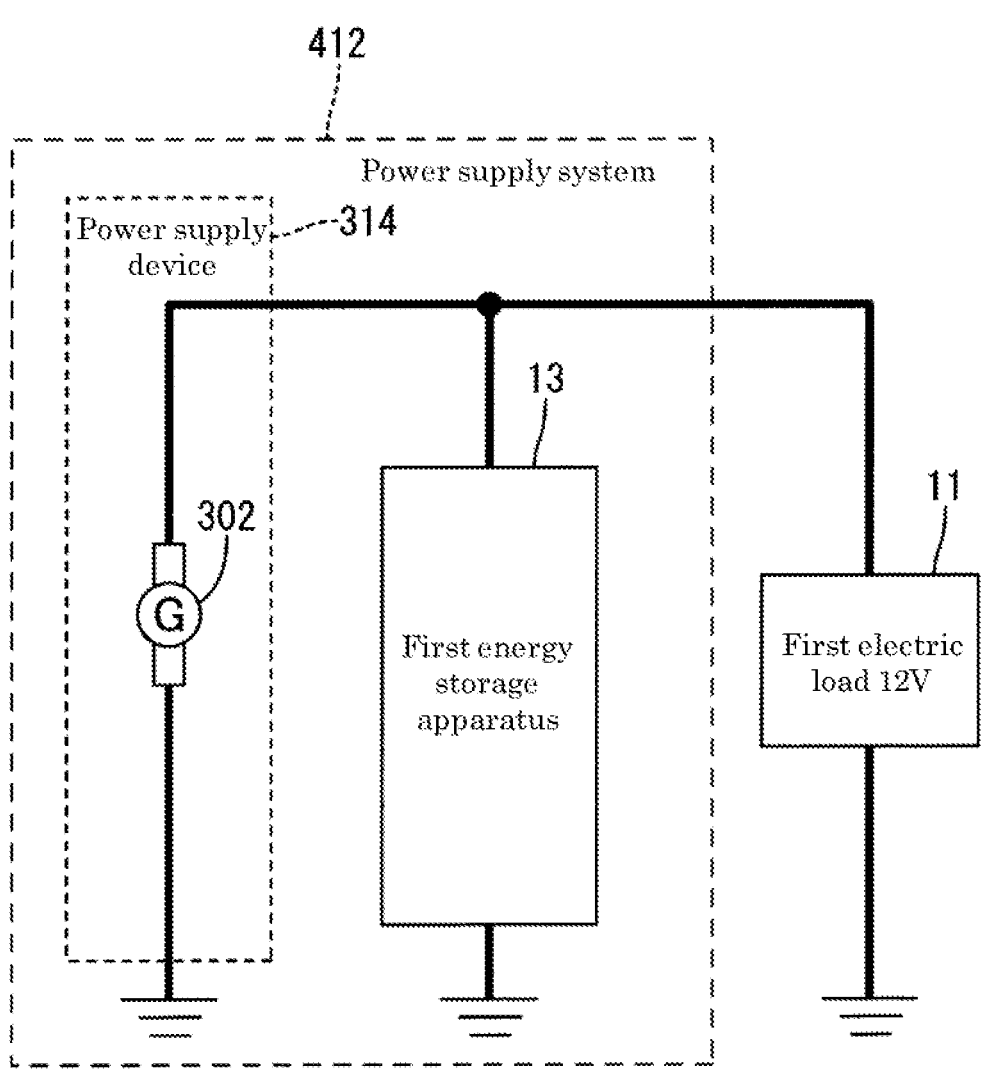
FIG. 9 is a block diagram illustrating a power supply system according to a fourth embodiment.

With reference to FIG. 9, a configuration of a power supply system 412 of the fourth embodiment will be described. The vehicle 1 of the fourth embodiment is also an engine automobile, and includes the generator 302 (alternator). The generator 302 is an example of the power supply apparatus. The first electric load 11 of the fourth embodiment also includes the engine starting device such as the cell motor.

(2) Processing for Diagnosing Failure of Current Breaking Device

The failure diagnosis processing of the fourth embodiment is executed when the vehicle 1 is stopped. Because the engine is rotating while the vehicle is stopped, the generator 302 generates the power. When the generator 302 generates the power, the power is supplied to the first electric load 11 by the generator 302, and the first energy storage apparatus 13 is charged by the generator 302. Because the first energy storage apparatus 13 is charged, the charge current flows through the first energy storage apparatus 13.

The timing of executing the failure diagnosis processing of the fourth embodiment can be appropriately determined as long as the generator 302 generates the power. However, in order to reduce the surge voltage, desirably the charge current supplied from the generator 302 to the first energy storage apparatus 13 is small and stable. Thus, the BMU 21 of the fourth embodiment executes the failure diagnosis process when the engine vehicle is stopped.

The failure diagnosis processing of the fourth embodiment is substantially the same as the failure diagnosis processing of the first embodiment in other points, so that the description thereof will be omitted.

(3) Effect of First Embodiment

According to the failure diagnosis method of the fourth embodiment, the failure diagnosis is performed when the power is supplied from the generator 302 to the first electric load 11 and the first energy storage apparatus 13, so that the failure of the current breaking device 21A can be diagnosed while the power supply to the first electric load 11 is continued.

According to the failure diagnosis method of the fourth embodiment, the supply step is executed when the vehicle 1 is stopped. While the vehicle is stopped, the engine rotation speed is stabilized in a lower state than that while the vehicle is traveling, so that the charge current flowing through the first energy storage apparatus 13 is small and stable. Thus, the surge voltage can be reduced.

Fifth Embodiment

A fifth embodiment is a modification of the first embodiment.

(1) Configuration of Power Supply System

Figure 10:
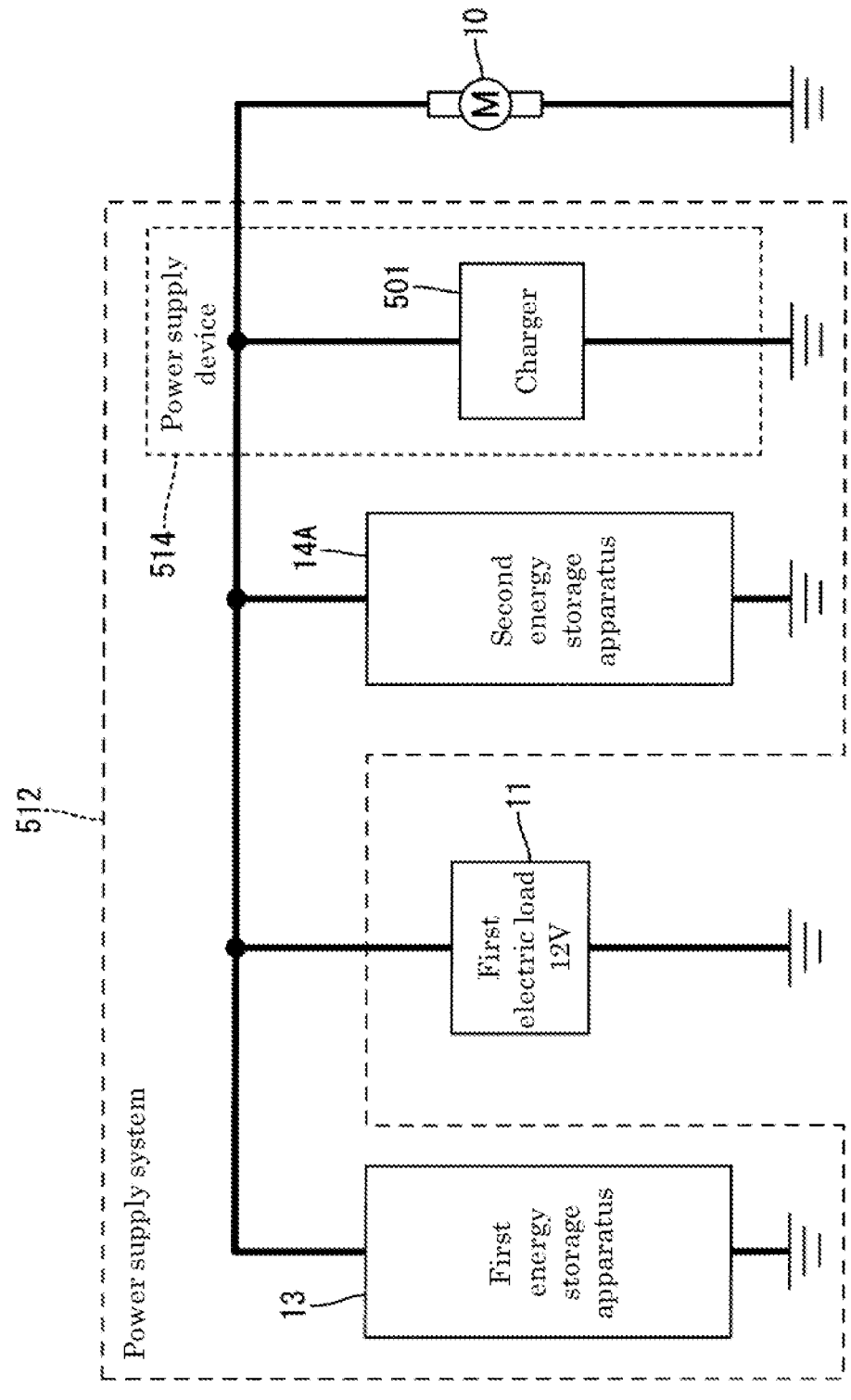
FIG. 10 is a block diagram illustrating a power supply system according to a fifth embodiment.

With reference to FIG. 10, a configuration of a power supply system 512 of the fifth embodiment will be described. The vehicle 1 of the fifth embodiment is an electric automobile or a plug-in hybrid automobile (hereinafter, simply referred to as an electric automobile). The electric automobile includes an electric motor 10 that is a vehicle driving source, the second energy storage apparatus 14A having a high voltage (for example, 100 V) that supplies the power to the electric motor 10, and a charger 501 to which an external power supply (not illustrated) is connected. The charger 501 is an example of the power supply apparatus. When an external power supply is connected to the charger 501, the first energy storage apparatus 13 and the second energy storage apparatus 14A are charged by the external power supply. When the external power source is connected to the charger 501, the power is supplied to the first electric load 11 from the external power source.

(2) Processing for Diagnosing Failure of Current Breaking Device

The failure diagnosis processing of the fifth embodiment is executed when the vehicle is parked and charged by the external power supply. The parking means the state in which the vehicle 1 is stopped and the engine is stopped.

The power is supplied from the external power supply to the first energy storage apparatus 13, so that the charge current flows through the first energy storage apparatus 13. The timing of executing the failure diagnosis processing of the fifth embodiment can be appropriately determined when the vehicle 1 is parked and when the power is supplied by the external power supply.

The failure diagnosis processing of the fifth embodiment is substantially the same as the failure diagnosis processing of the first embodiment in other points, so that the description thereof will be omitted.

(3) Effect of First Embodiment

According to the failure diagnosis method of the fifth embodiment, by performing the failure diagnosis when the external power supply is connected to the charger 501, the failure of the current breaking device 21A can be diagnosed while the power supply to the first electric load 11 is continued.

Other Embodiments

The present invention is not limited to the embodiments described with reference to the above description and the drawings. For example, the following embodiments are also included in the technical scope of the present invention.

(1) Although the electric automobile has been described as an example of the vehicle 1 in the first embodiment, the vehicle 1 may be a plug-in hybrid automobile. In the first energy storage apparatus 13 included in the plug-in hybrid automobile, a relatively large and unstable discharge current flows during traveling, and a large charge current flows due to a regenerative current. During parking, the charge is performed by the external power supply as in the fifth embodiment. For this reason, there are relatively few scenes where the small and stable discharge is performed. In the first embodiment, because the failure diagnosis is performed when the first energy storage apparatus 13 is being charged, it is particularly useful in the case of the plug-in hybrid automobile in which there are relatively few scenes of the discharge.

(2) In the first embodiment, it is determined whether power is supplied from the second energy storage apparatus 14A to the first electric load 11 (S103). Alternatively, when power is certainly supplied from the second energy storage apparatus 14A to the first electric load 11, the determination in S103 may not necessarily be performed.

(3) In the second embodiment, it is determined whether the power supply apparatus 14 is in the state in which power can be supplied (S202). Alternatively, when the power supply apparatus 14 is certainly in the state in which power can be supplied, the determination in S202 may not necessarily be performed.

(4) The third embodiment has been described as the modification of the first embodiment, but may be the modification of the second embodiment. Specifically, in the third embodiment, the failure diagnosis processing may be executed when the first energy storage apparatus 13 discharges.

(5) In the fourth embodiment, the case where the DC-DC converter 14B is not connected between the first electric load 11 and the generator 302 has been described as an example. Alternatively, the DC-DC converter 14B may be connected. In this case, similarly to the second embodiment, the failure diagnosis processing may be executed when the first energy storage apparatus 13 discharges.

(6) In the fifth embodiment, the case where the DC-DC converter 14B is not connected between the first electric load 11 and the charger 501 has been described as an example. Alternatively, the DC-DC converter 14B may be connected. In this case, similarly to the second embodiment, the failure diagnosis processing may be executed when the first energy storage apparatus 13 discharges.

(7) In the above embodiment, the case where the energy storage apparatus includes the plurality of secondary batteries 20A (energy storage devices) has been described as an example. Alternatively, only one secondary battery 20A may be provided.

(8) In the above embodiment, the case where the secondary battery 20A, the current breaking device 21A, and the BMU 21 are accommodated in the container 71 of the first energy storage apparatus 13 has been described as an example. Alternatively, at least the secondary battery 20A may be accommodated in the container 71, and the current breaking device 21A and the BMU 21 may be provided outside the container 71.

(9) In the above embodiment, the secondary battery 20A has been described as an example of the energy storage device. Alternatively, the energy storage device may be a capacitor accompanying an electrochemical reaction.

(10) In the above embodiment, the engine automobile, the electric automobile, the plug-in hybrid automobile, and the like have been described as examples of the vehicle 1. However, the vehicle 1 is not limited thereto. For example, the vehicle 1 may be a forklift or an automatic guided vehicle (AGV) that travels by the electric motor.

In the above embodiment, the vehicle 1 has been described as an example of the moving body. However, the moving body is not limited to the vehicle. For example, another moving body may be used, which involves the issue of a power failure, such as a flying body, a train, or a motorcycle.

(11) In the above embodiment, the power supply system of the moving body has been described as an example of the power supply system. However, the power supply system is not limited to one that supplies power to the moving body. The power supply system may supply power to a device (such as a medical device) other than the moving, which involves the issue of a power failure.

The invention claimed is:

1. A method for diagnosing failure of a current breaking device included in a power supply system of a moving body, the power supply system including a first energy storage apparatus connected to a first electric load of the moving body and a power supply apparatus connected in parallel to the first energy storage apparatus, the first energy storage apparatus including an energy storage device, an external terminal, the current breaking device connected in series with the energy storage device and disposed between the energy storage device and the external terminal, and a current sensor that measures a charge current of the energy storage device, the failure diagnosis method comprising:

supplying in which the power supply apparatus supplies power to the first electric load and to the first energy storage apparatus;

commanding the current breaking device to perform cutoff while power is supplied from the power supply apparatus to the first electric load and to the first energy storage apparatus;

measuring the charge current of the energy storage device using the current sensor while the cutoff is issued to the current breaking device, and determining presence or absence of failure of the current breaking device based on the charge current of the energy storage device measured by the current sensor while the cutoff is issued to the current breaking device, wherein:

the current sensor measures whether a current value is greater than or equal to a first predetermined value, in the supplying, a voltage is converted by a voltage converter such that the current value of the current flowing through the first energy storage apparatus becomes less than or equal to a second predetermined value, and when the current value of the measured charge current is greater than or equal to a third predetermined value when the current is flowing through the first energy storage apparatus, the method further comprises determining whether the power is supplied from a second energy storage apparatus to the first electric load and procession to the commanding of the current breaking device to perform cutoff.

2. The method for diagnosing the failure of the current breaking device according to claim 1, further comprising determining whether the energy storage device is being charged after the power supply apparatus supplied power to the first energy storage apparatus, wherein the commanding is executed when the determining determines that the energy storage device is being charged.

3. The method for diagnosing the failure of the current breaking device according to claim 1, wherein the mobile body is an electric automobile driven by an electric motor, and the power supply apparatus includes a second energy storage apparatus that supplies power to the electric motor and the voltage converter that is connected between the first electric load and the second energy storage apparatus and converts voltage applied from the second energy storage apparatus.

4. The method for diagnosing the failure of the current breaking device according to claim 1, wherein the power supply apparatus includes a second energy storage apparatus that supplies power to a second electric load different from the first electric load and the voltage converter that is connected between the first electric load and the second energy storage apparatus and converts voltage applied from the second energy storage apparatus.

5. The method for diagnosing the failure of the current breaking device according to claim 1, wherein the moving body is an engine automobile, and the power supply apparatus is a generator using an engine of the engine automobile as a power source.

6. The method for diagnosing the failure of the current breaking device according to claim 5, wherein the supplying is executed when the moving body is stopped.

7. The method for diagnosing the failure of the current breaking device according to claim 1, wherein the mobile body is an electric automobile driven by an electric motor, the power supply system includes a second energy storage apparatus that supplies power to the electric motor, and the power supply apparatus is a charger to which an external power supply charging the first energy storage apparatus and the second energy storage apparatus is connected.

8. The method according to claim 1, wherein the diagnosing steps occur when the moving body is immobile with the moving body in an operational state.

9. A method for diagnosing failure of a current breaking device included in a power supply system of a moving body, the power supply system including a first energy storage apparatus connected to a first electric load of the moving body and a power supply apparatus including a voltage converter connected in parallel to the first energy storage apparatus, the first energy storage apparatus including an energy storage device, an external terminal, the current breaking device connected in series with the energy storage device and disposed between the energy storage device and the external terminal, and a current sensor that measures a discharge current of the energy storage device, the failure diagnosis method comprising:

supplying power from the first energy storage apparatus to the first electric load while keeping a state where power is supplied from the power supply apparatus to the first electric load;

commanding the current breaking device to perform cut-off while power is supplied from the first energy storage apparatus to the first electric load;

measuring the discharge current of the energy storage device using the current sensor while the cutoff is issued to the current breaking device, determining presence or absence of failure of the current breaking device based on the discharge current of the energy storage device measured by the current sensor while the cutoff is issued to the current breaking device, and instructing the voltage converter to convert a voltage measured at a point adjacent the voltage converter into a voltage equal to or less than a voltage of the first energy storage apparatus and greater than or equal to an operating voltage of the first electric load.

10. The method for diagnosing the failure of the current breaking device according to claim 9, further comprising determining whether power is supplied from the power supply apparatus to the first electric load, wherein the commanding is executed when the determining determines that power is supplied.

11. The method according to claim 9, wherein the diagnosing steps occur when the moving body is immobile with the moving body in an operational state.

12. An energy storage apparatus mounted on a moving body including an electric load and a power supply apparatus, the energy storage apparatus comprising:

an energy storage device;

an external terminal;

a current breaking device connected in series with the energy storage device and disposed between the energy storage device and the external terminal;

a current sensor that measures a charge current of the energy storage device; and a management unit, wherein the management unit executes:

command processing for commanding the current breaking device to perform cutoff while power is supplied from the power supply apparatus to the electric load and the energy storage apparatus; and determination processing for:

measuring the charge current of the energy storage device using the current sensor while the cutoff is issued to the current breaking device, and determining presence or absence of failure of the current breaking device based on the charge current of the energy storage device measured by the current sensor while the cutoff is issued to the current breaking device, wherein:

the current sensor measures whether a current value is greater than or equal to a first predetermined value, in the supplying of the power, a voltage is converted by a voltage converter such that the current value of the current flowing through the first energy storage apparatus becomes less than or equal to a second predetermined value, and when the current value of the measured charge current is greater than or equal to a third predetermined value when the current is flowing through the first energy storage apparatus, the method further comprises determining whether the power is supplied from a second energy storage apparatus to the first electric load and procession to the commanding of the current breaking device to perform cutoff.

13. The energy storage apparatus according to claim 12, wherein the command and determination processing occurs when the moving body is immobile with the moving body in an operational state.

14. An energy storage apparatus mounted on a moving body including an electric load, a power supply apparatus and a voltage converter, the energy storage apparatus comprising:

an energy storage device;

an external terminal;

a current breaking device connected in series with the energy storage device and disposed between the energy storage device and the external terminal;

a current sensor that measures a discharge current of the energy storage device; and a management unit, wherein the management unit includes:

command processing for commanding the current breaking device to perform cutoff when power is supplied from the energy storage apparatus to the electric load while keeping a state where power is supplied from the power supply apparatus to the electric load when power is not supplied from the energy storage apparatus to the electric load; and determination processing for:

measuring the discharge current of the energy storage device using the current sensor while the cutoff is issued to the current breaking device, determining presence or absence of failure of the current breaking device based on the discharge current of the energy storage device measured by the current sensor while the cutoff is issued to the current breaking device, and instructing the voltage converter to convert a voltage measured at a point adjacent the voltage converter into a voltage equal to or less than a voltage of the first energy storage apparatus and greater than or equal to an operating voltage of the electric load.

15. The energy storage apparatus according to claim 14, wherein the command and determination processing occurs when the moving body is immobile with the moving body in an operational state.

\* \* \* \* \*